United States Patent [19]
Blaker et al.

[11] Patent Number: 5,490,178
[45] Date of Patent: Feb. 6, 1996

[54] POWER AND TIME SAVING INITIAL TRACEBACKS

[75] Inventors: David M. Blaker, Emmaus; Gregory S. Ellard, Forest Park; Mohammad S. Mobin, Whitehall, all of Pa.

[73] Assignee: AT&T Corp., Murray Hill, N.J.

[21] Appl. No.: 153,333

[22] Filed: Nov. 16, 1993

[51] Int. Cl.$^6$ .......................... H04L 27/06; H03M 13/12
[52] U.S. Cl. ................................................ 375/341; 371/43
[58] Field of Search .................................. 375/262, 340, 375/341; 371/43

[56] References Cited

U.S. PATENT DOCUMENTS

| | | | |
|---|---|---|---|
| 3,789,360 | 1/1974 | Clark, Jr. et al. | 371/43 |
| 4,493,082 | 1/1985 | Cumberton et al. | 371/43 |
| 4,583,078 | 4/1986 | Shenoy et al. | 371/43 |
| 4,748,626 | 5/1988 | Wong | 371/30 |
| 4,777,636 | 10/1988 | Yamasaki et al. | 371/43 |
| 4,797,887 | 1/1989 | Yamasaki et al. | 371/43 |
| 4,868,830 | 9/1989 | Pollara-Bozzola | 371/43 |
| 4,905,317 | 2/1990 | Suzuki et al. | 371/43 |
| 5,220,570 | 6/1993 | Lou et al. | 371/43 |
| 5,329,537 | 7/1994 | Alard et al. | 371/43 |

FOREIGN PATENT DOCUMENTS

| | | | |
|---|---|---|---|
| 0127984 | 12/1984 | European Pat. Off. | H04L 1/10 |
| 62-233933 | 10/1987 | Japan | H03M 13/12 |
| 2-054639 | 2/1990 | Japan | H04L 1/00 |

OTHER PUBLICATIONS

Eight Annual International Phoenix Conference on Computers And Communications. 1989 Conference Proceedings, Scottsdale, USA 22–24 Mar. 1989, 22 Mar. 1989, IEEE, New York, US, pp. 144–148, XP40911 M. W. Marcellin/T. R. Fischer: Generalized Predictive Trellis Coded Quantization of Speech, pp. 144 and 147.

Journal of VLSI Signal Processing, vol. 5, No. 1, Jan. 1993, Dordrecht NL, pp. 85–94, XP364288, R. Cypher/C. B. Shung: "Generalized Trace–Back Techniques for Survivor Memory Management in the Viterbi Algorithm", pp. 90 and 92.

*Primary Examiner*—Young Tse
*Attorney, Agent, or Firm*—David L. Smith

[57] ABSTRACT

A digital communication system including a Viterbi decoder for tracing a path through a trellis of individual state information and method of operation are disclosed. The traceback determines a decoded symbol. A trellis of branch origin data is stored in an array of registers. The branch origin data associated with a symbol instant is a cell. Each cell of data is generated by execution of an update instruction form a digital signal process (DSP) to the coprocessor. A first predetermined traceback length is written to a traceback length register. The first predetermined traceback length is small to minimize tracebacks cycling into branch origin data from a previous transmission burst. A traceback is initiated by the DSP providing the coprocessor a single traceback instruction. The Viterbi decoder alternates between update and traceback instructions. At a predetermined symbol instant, the traceback length is increased to a second predetermined length by over-writing the traceback length register. The second predetermined length is selected relative to the predetermined symbol instant to assure tracebacks do not cycle into branch origin data from a previous transmission burst. After all updates are complete, the update instruction is omitted and the traceback instruction repeatedly executed until all symbols from a transmission burst are decoded.

7 Claims, 8 Drawing Sheets ved herein by
POWER AND TIME SAVING INITIAL TRACEBACKS

CROSS-REFERENCE TO RELATED APPLICATION

This application is related to the following concurrently filed, applications, each of which is incorporated herein by herein by reference:

Application Ser. No. 08/153,334, entitled "Efficient Utilization of Present State/Next State Registers", filed Nov. 16, 1993, by D. Blaker, M. Diamondstein, G. Ellard, M. Mobin, H. Sam and M. Thierbach, our docket number Blaker 3-2-3-3-4-10;

Application Ser. No. 08/152,531, entitled "Variable Length Tracebacks", filed Nov. 16, 1993, by D. Blaker, G. Ellard, and M. Mobin, our docket number Blaker 4-4-4;

Application Ser. No. 08/152,805, entitled "Digital Receiver with Minimum Cost Index Register", filed Nov. 16, 1993, by D. Blaker, G. Ellard, M. Mobin and H. Sam, our docket number Blaker 2-2-2-3;

Application Ser. No. 08/153,405, now U.S. Pat. No. 5,432,804, entitled "Digital Processor and Viterbi Decoder Having Shared Memory", filed Nov. 16, 1993, by M. Diamondstein, H. Sam and M. Thierbach, our docket number Diamondstein 1-2-8;

Application Serial No. 08/152,807, now U.S. Pat. No. 5,454,014, entitled "Digital Signal Processor", filed Nov. 16, 1993, by D. Blaker, G. Ellard, M. Mobin, and M. Thierbach, our docket number Blaker 5-5-5-9; and Application Ser. No. 08/153,391, entitled "Digital Signal Processor", filed Nov. 16, 1993, by D. Blaker, G. Ellard and M. Mobin, our docket number Blaker 1-1-1.

TECHNICAL FIELD

This invention relates generally to radio transmission such as digital cellular telephony and particularly to executing short length tracebacks in a Viterbi decoder to save power and time.

BACKGROUND OF THE INVENTION

Radio waves propagate at the speed of light. In cellular radio transmissions, a transmitted signal can arrive at a receiver at multiple times due to refraction, diffraction or reflection. Refraction occurs when the path of propagation of the transmitted signal bends to follow the curvature of the earth. Diffraction occurs when the path of propagation passes around obstacles. Reflection occurs when a transmitted signal bounces off of either the atmosphere, or obstacles in the path of propagation such as terrain, water tanks or buildings. Each of these phenomena can contribute to a multiplicity of signals being received at the receiver. Each of these signals was initially the originally transmitted signal. Each of the received signals is uniquely distorted by the particular path it transverses. Each signal is received at slightly different times due to the differences in the length of the path of propagation. If the transmitter is mobile, such as a mobile cellular telephone, the received signals vary. When the transmitted signal is digital symbols, intersymbol interference occurs and may extend over several symbol time periods. The receiver must reliably extract the transmitted signal from these various received signals.

Time division multiple access encoded information is transmitted in multiple channels per carrier. In accordance with the Group Special Mobile (GSM) standard, there are eight channels per carrier. Each channel is provided a time slot of one-half millisecond. Each time slot provides a frame of bits, sometimes called a transmission burst, during transmission. A portion of the bits in each frame are set aside as a training segment for system use. The bits of the training segment, or a portion of them, have been used as a means to adapt the decoding process to compensate for channel characteristics. However, these bits are received only once during each frame whereas the channel characteristics can change over the entire time during which the frame is transmitted, such that the channel characteristics during the training segment are not representative of the channel characteristics of the entire frame.

A Viterbi decoder is a maximum likelihood decoder that provides forward error correction. Viterbi decoding is used in decoding a sequence of encoded symbols, such as a bit stream. The bit stream can represent encoded information in telecommunication system transmission through various media with each set of bits representing a symbol instant. In the decoding process, the Viterbi decoder works back through a sequence of possible bit sequences at each symbol instant to determine which one bit sequence, is most likely to have been transmitted. The possible transitions from a bit at one symbol instant, or state, to a bit at a next, subsequent, symbol instant or state is limited. Each possible transition from one state to a next state can be shown graphically and is defined as a branch. A sequence of interconnected branches is defined as a path. Each state can only transition to a limited number of next states upon receipt of the next bit in the bit stream. Thus, some paths survive and other paths do not survive during the decoding process. By eliminating those transitions that are not permissible, computational efficiency can be achieved in determining the most likely paths to survive. The Viterbi decoder typically defines and calculates a branch metric associated with each branch and employs this branch metric to determine which paths survive and which paths do not survive.

A branch metric is calculated at each symbol instant for each possible branch. Each path has an associated metric, accumulated cost, that is updated at each symbol instant. For each possible transition, the accumulated cost for the next state is calculated as the lesser of the sum of the branch metric for the possible transitions and the path accumulated cost at the previous state.

While several paths survive the transition from one symbol instant to the next symbol instant, there is only one minimum accumulated cost path from the least of the minimum accumulated costs at a symbol instant, back through the possible branches. Representing the sequential symbol instants in an array is referred to as a trellis. Identifying the minimum accumulated cost path starting with a given symbol instant it referred to as a traceback. The number of symbol instants back through the trellis that the minimum accumulated cost path extends is the length, or depth, of the traceback. The individual state in the trellis associated with the minimum accumulated cost at the end of the traceback is translated into the most likely bit to have been transmitted in that symbol instant. This bit is referred to as a decoded symbol.

Historically, Viterbi decoders have used a fixed length traceback to decode encoded symbols. The longer the traceback length, the greater the accuracy in determining a decoded symbol. When using modulo addressing, the trellis appears to be circular. Initial long tracebacks cycle into portions of the trellis having surviving branch data from a previous transmission burst that has not yet been overwritten. A need remains in the art for a technique to initially provide short length tracebacks in a Viterbi decoder to minimize tracebacks from cycling into branch origin data from a previous transmission burst that has not yet been over-written.

SUMMARY OF THE INVENTION

In accordance with one aspect of the invention, a method of operating a digital communication system for tracing a path through a trellis of surviving branch data is disclosed. The traceback determines a decoded symbol. A trellis of surviving branch data is stored in an array of registers. The method includes initiating tracebacks having a first predetermined traceback length from sequential symbol instants. Each traceback traces a path back through the trellis a first predetermined number of symbol instants to determine a decoded symbol. These decoded symbols are typically discarded. The first predetermined traceback length is small to minimize tracebacks cycling into surviving branch data from a previous transmission burst that has not yet been over-written. At a predetermined symbol instant the traceback length is increased to a second predetermined length. The second predetermined length is selected relative to the predetermined symbol instant to assure a traceback does not cycle into surviving branch data from a previous transmission burst. Decoded symbols determined from tracebacks having the second predetermined length are retained as final decoded symbols.

In another embodiment of the invention intermediate tracebacks are executed having a third predetermined length. The third predetermined length has a magnitude greater than the first predetermined length and less than the second predetermined length.

DETAILED DESCRIPTION

Figure 1:
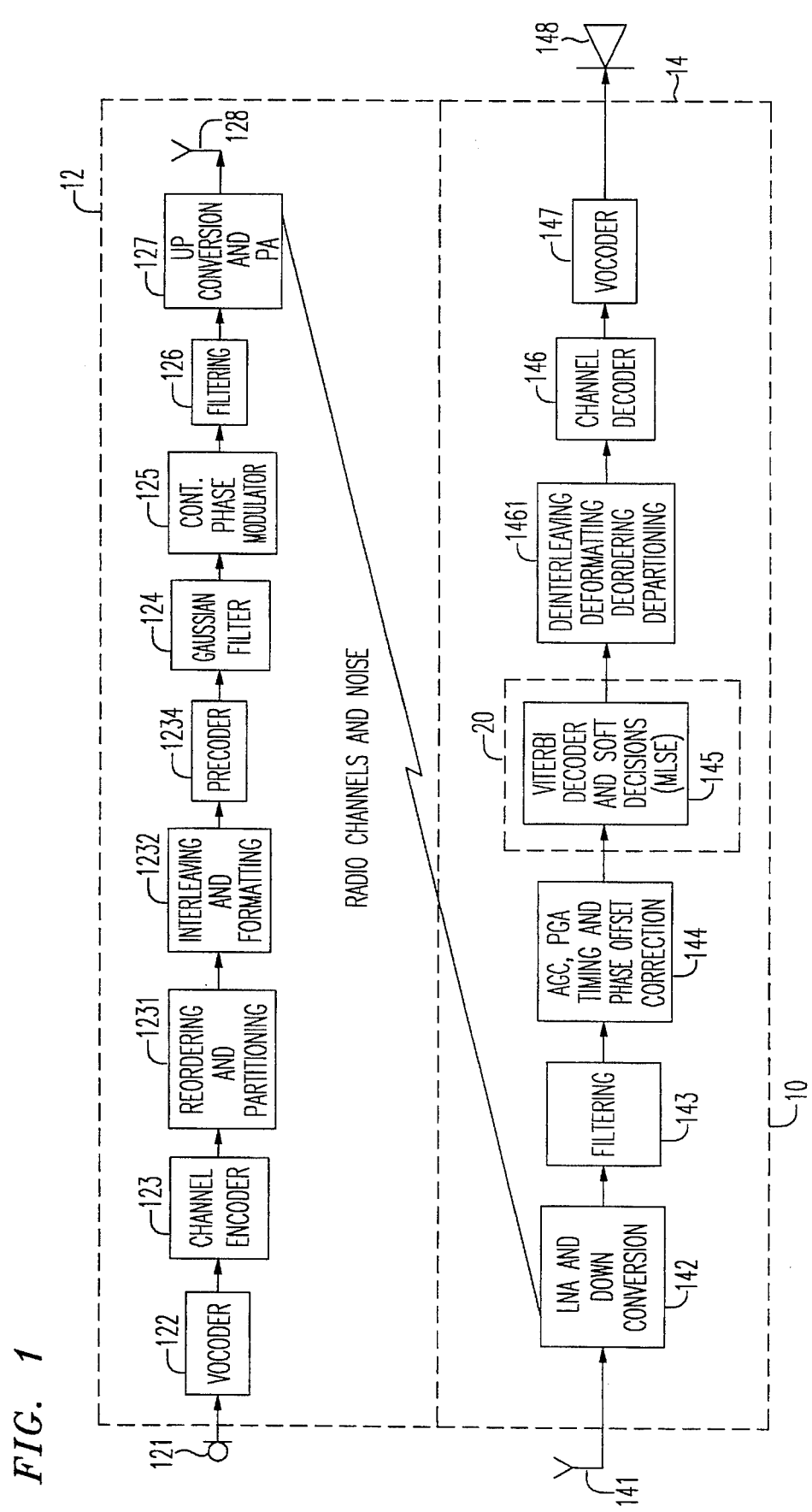
FIG. 1 is a block diagram of a transceiver, in accordance with an illustrative embodiment of the present invention.

Transceiver 10 shown in the block diagram of FIG. 1, is an illustrative embodiment of the invention. Transceiver 10 is a communication system or portion of a communication system such as a mobile digital cellular telephone. Transceiver 10 is comprised of a transmitter 12 and receiver 14.

As shown in FIG. 1, a microphone 121 for converting a voice signal into an electrical signal is coupled to a vocoder 122. The vocoder is coupled to the channel encoder 123, which includes reordering and partitioning 1231, interleaving and formatting 1232, and precoder 1234. The output of the channel encoder is coupled to a filter 124. The filter output is coupled to a continuous phase modulator 125, which in turn is coupled to another filter 126. Filter 126 is coupled to an up converter and power amplifier 127 which in turn is coupled to an antenna 128.

On the receiver side, antenna 141 is coupled to a low noise amplifier and down conversion 142, which is coupled to filtering 143. Filtering 143 is coupled to automatic gain control 144 which conditions the signal for input to the Viterbi decoder 145. The Viterbi decoder is coupled to a channel decoder 146 which includes deinterleaving, deformating, deordering and departitioning 1461. The channel decoder is coupled to a vocoder 147. The vocoder is coupled to a speaker 148.

Figure 2:
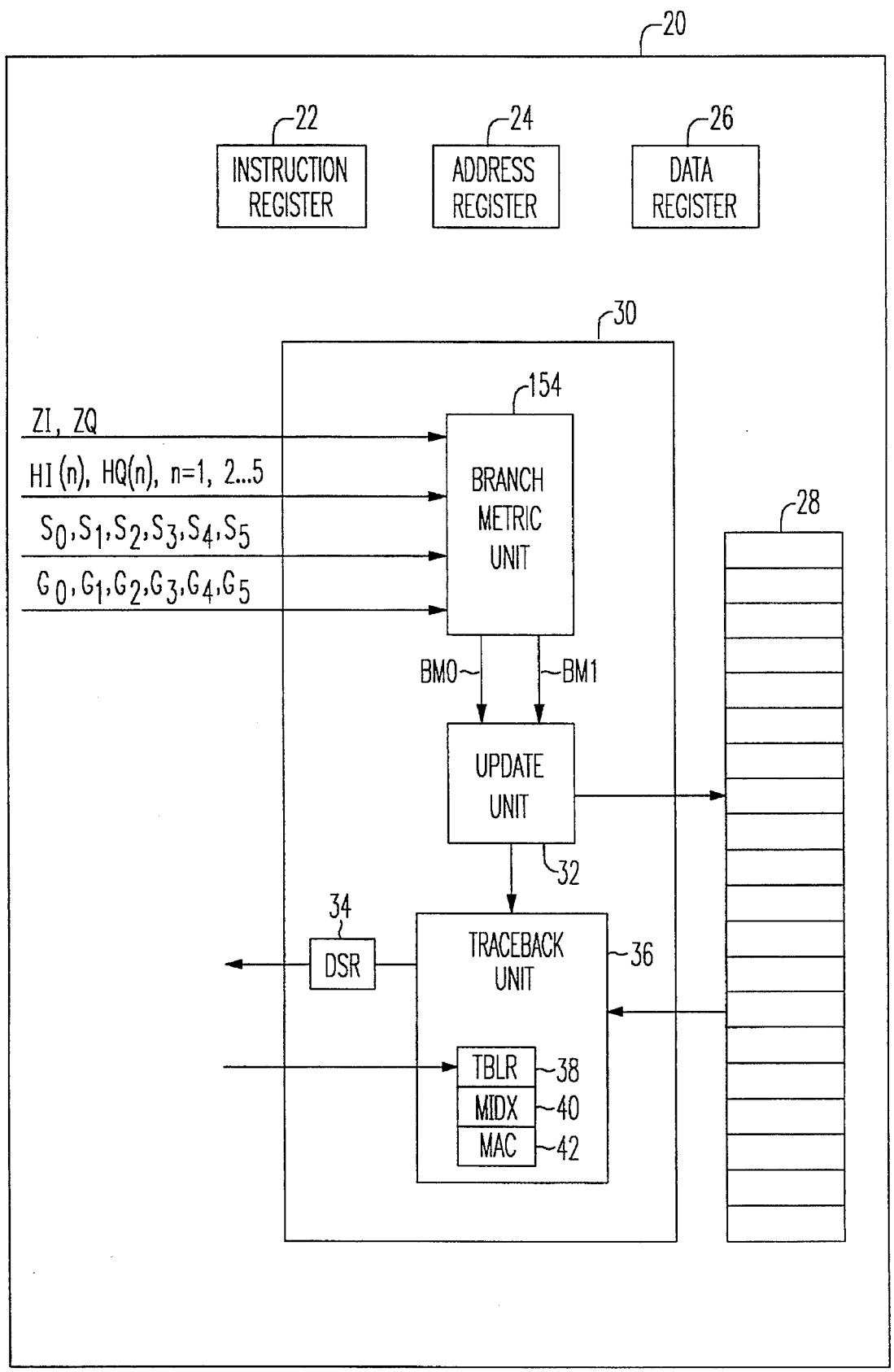
FIG. 2 is a partial block diagram of a transceiver showing digital signal processor having an error correction coprocessor.

FIG. 2 is a partial block diagram of a transceiver 10, shown in more detail. Transceiver 10 includes a digital signal processor (DSP) 20 which includes the Viterbi decoder 145 shown in FIG. 1. DSP 20 also includes an error correction coprocessor 30. Error correction coprocessor 30 may be embedded in DSP 20. Some of the registers of random access memory (RAM) of DSP 20 are allocated as a traceback RAM 28. Alternatively, dedicated RAM could be provided. Traceback RAM 28 may be accessible to both DSP 20 and coprocessor 30.

An indirect addressing technique is used to write data to and read data from the coprocessor 30. To write data to a register at an address in coprocessor 30, an address is written to address register 24 and the data is written to data register 26. The address is transferred from DSP 20 to an address generator in coprocessor 30 and is translated into the address of a corresponding register. To read data from a register at an address in coprocessor 30, an address is written into address register 24 of DSP 20. The address is transferred to the coprocessor 30 and translated to the address of a corresponding register in the coprocessor 30. The data at the addressed coprocessor register is read by reading data register 26 of DSP 20. Instructions are passed to the coprocessor 30 by writing an instruction into the instruction register 22.

In the above manner, the complex received signals ZI and ZQ, complex tap weights HI(n) and HQ(n), n=1, 2, ... 5, soft symbols $S_0$ through $S_5$ and generating polynomials $G_0$ through $G_5$ are provided as inputs of the branch metric unit 154 within coprocessor 30. The branch metric unit provides two branch metric values, BMO and BM1, per individual state to update unit 32. The branch metric values are utilized as is known in the art to update the accumulated cost.

Update unit 32 provides to traceback unit 36 the minimum accumulated cost which is stored in the minimum accumulated cost (MAC) register 42. Update unit 32 also provides the address of the register in traceback RAM 28 in which the minimum accumulated cost has occurred, and stores that address in the minimum accumulated cost (MIDX) register 40.

Traceback unit 36 provides individual state information defining the minimum accumulated cost path through the trellis, as well as soft decision confidence level in decoded symbols to traceback RAM 28. At the end of a traceback, update unit 32 also provides a decoded symbol to DSP 20 by way of decoded symbol register (DSR) 34.

Traceback length register (TBLR) 38 is the register in which the traceback length is stored. The traceback length can be changed by over-writing the existing traceback length stored in TBLR 38. In this manner, the traceback length is programmable. A traceback, initiated by a traceback instruction to coprocessor 30 from DSP 20, can be executed and the traceback length can be different than previous or subsequent tracebacks. An update instruction from the DSP causes another cell of traceback RAM to be filled as the trellis is being constructed. Tracebacks can be executed between two update instructions or even after an update instruction when there are no more symbols to update, such as when the trellis is complete. Such tracebacks can be of different lengths and multiple tracebacks may be executed at a single symbol instant.

Figure 3:
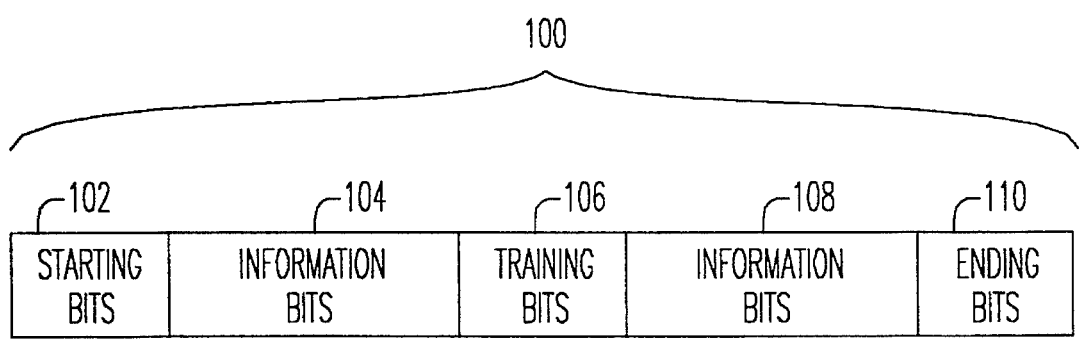
FIG. 3 is an illustration showing the structure of bits in an exemplary transmission burst.

An exemplary frame, or transmission burst, 100 of information transmitted, typically by a base station or mobile digital cellular telephone to the other, is shown in FIG. 3. The transmission burst contains a predetermined number of bits. Each frame includes starting bits 102, a first set of information bits 104, training bits 106, a second set of information bits 108 and ending bits 110. Typically there are three starting and ending bits, 58 bits in each set of information bits, and 26 training bits, for a total of 148 bits per frame. The training bits are also known. The starting and ending bits are known and typically are zeros.

The training bits are used to calculate an initial estimate of the channel between the transmitting base station and the receiving mobile digital cellular telephone. A perfect digital signal is transmitted. However, the received signal is distorted due to noise and interference. As the mobile digital cellular telephone moves through its environment, the characteristics of the channel over which the signals are transmitted and received change.

Figure 4:
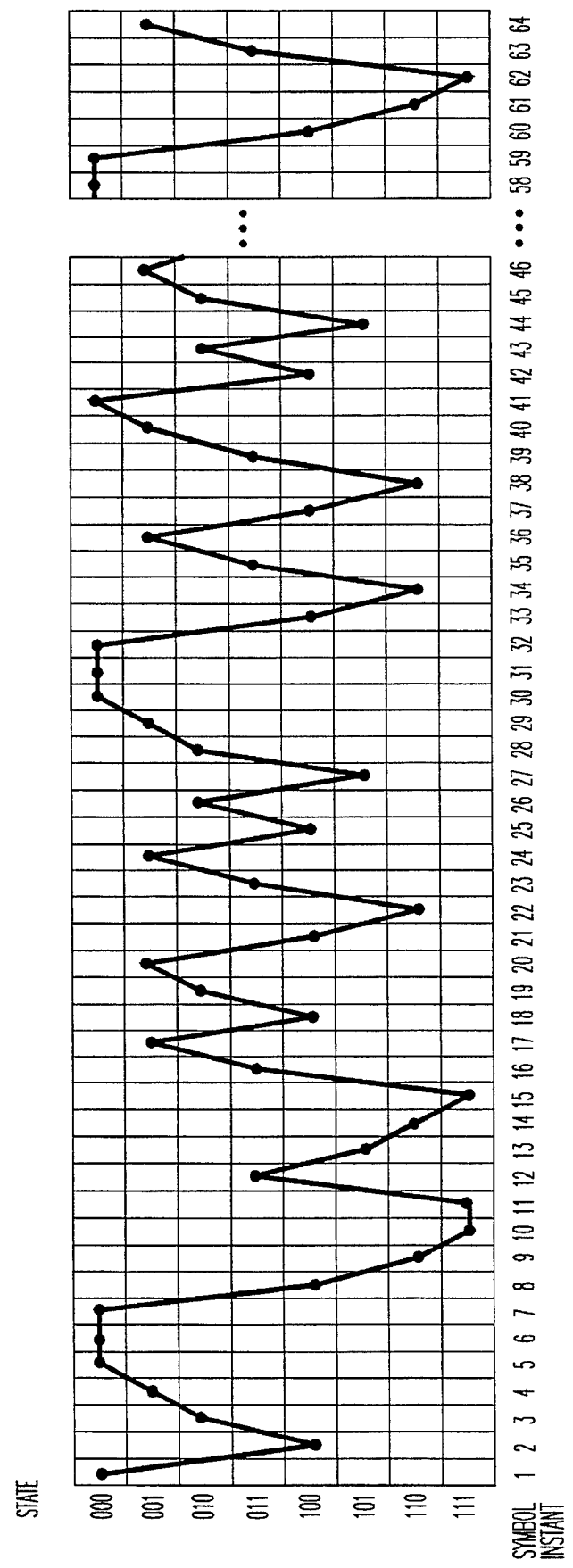
FIG. 4 is a matrix representing a trellis diagram useful in describing the present invention.

FIG. 4 shows a trellis diagram in traceback RAM 28 useful in understanding the traceback operation in a Viterbi decoder. At each state or symbol instant (shown horizontally), there are a number of states (shown vertically) that range from zero up to $2^{C-1}-1$ where C is the constraint length. These $2^{C-1}$ states are referred to as individual states. The trellis diagram shown in FIG. 4 is constructed one symbol instant at a time, as is known in the art. The trellis entries at each symbol instant comprise a cell. A single update instruction from DSP 20 to coprocessor 30 initiates an update operation by update unit 32 to produce a cell of trellis entries. At each symbol instant, each individual state of the illustrative embodiment shown in FIG. 4 can only transition to two possible individual states at the next symbol instant. Concomitantly, each individual state at the next symbol instant has only two possible previous individual states from which a transition to it can originate. Other decoders could have more than two transitions to a next state.

A branch metric is calculated at each symbol instant for each possible transition from an individual state at one symbol instant to an individual state at the next symbol instant. Various methods for calculating branch metrics are known in the art. The branch metric of both branches transitioning to a given next individual state are calculated, then added to the accumulated cost of the respective originating individual state. This results in two potential accumulated cost sums. A comparison is made of the two potential accumulated cost sums. An extremum branch metric, such as the lesser of the two sums, is selected as the next state accumulated cost. A transition corresponding to the lesser sum is the more likely transition from the two possible originating individual states to the given next individual state. The surviving branch data of the more likely transition is stored in traceback RAM 28 (forming the trellis of FIG. 4) as the surviving branch to the given next individual state as is known in the art. The lesser sum is the accumulated cost of the next individual state. This process is repeated for each of the next individual states and repeated also for each symbol instant until all of the symbols in the bit stream are decoded.

Traceback RAM 28 can be addressed using modulo addressing. This results in a finite length array appearing to be circular. Consider a traceback of length 60 initiated from symbol instant 30 in an array having 64 symbol instants designated 1 through 64. When the traceback is completed, the traceback terminates in symbol instant 34. The traceback starts in symbol instant 30, traces back through symbol instants 29, 28, 27 down through symbol instant 1, symbol instant 64, 63, 62 and so forth until reaching symbol instant 34. At symbol instant 34, the individual state associated with the minimum accumulated cost is translated into a decoded symbol.

The decoded symbol at each symbol instant can be obtained by waiting until the trellis is complete. Then, starting with the individual state in the last symbol instant having the minimum associated accumulated cost, trace back through the trellis once. At each symbol instant of this traceback, the originating individual state is translated into a decoded symbol for that symbol instant as is known in the art.

Alternatively at each symbol instant during the construction of the trellis, a predetermined length traceback operation can be initiated to obtain a decoded symbol at a previous symbol instant. The previous symbol instant will precede the symbol instant at which the traceback is initiated, the present symbol instant, by the traceback length. As the traceback RAM is filled with branch origin data, DSP 20 alternates instructions between update and traceback. Each update constructs one more cell in the trellis. Each traceback decodes a symbol. After all updates are complete, the update instruction is omitted and subsequent tracebacks decode the remaining symbols. Each occurrence a symbol instant increases, another traceback will be executed and will provide another decoded symbol. In this manner, for a constant length traceback, a series of decoded symbols at sequential symbol instants are decoded.

In accordance with the present invention, as the trellis is being constructed in traceback RAM 28, a traceback of a first predetermined length is executed from each symbol instant. The first predetermined length is small to minimize tracebacks cycling into branch origin data from a previous transmission burst that has not yet been over-written. At a predetermined symbol instant, the traceback length is increased to a second predetermined length. The second predetermined length is selected relative to the predetermined symbol instant to assure a traceback does not cycle into branch origin data from a previous transmission burst. Decoded symbols from tracebacks having the second predetermined length are retained as final decoded symbols. Alternatively, intermediate tracebacks having a third predetermined traceback length are executed. The third traceback length has a magnitude greater than the first predetermined length and less than the second predetermined length. Symbols decoded employing these intermediate length tracebacks may be used for channel adaptation.

Figure 5:
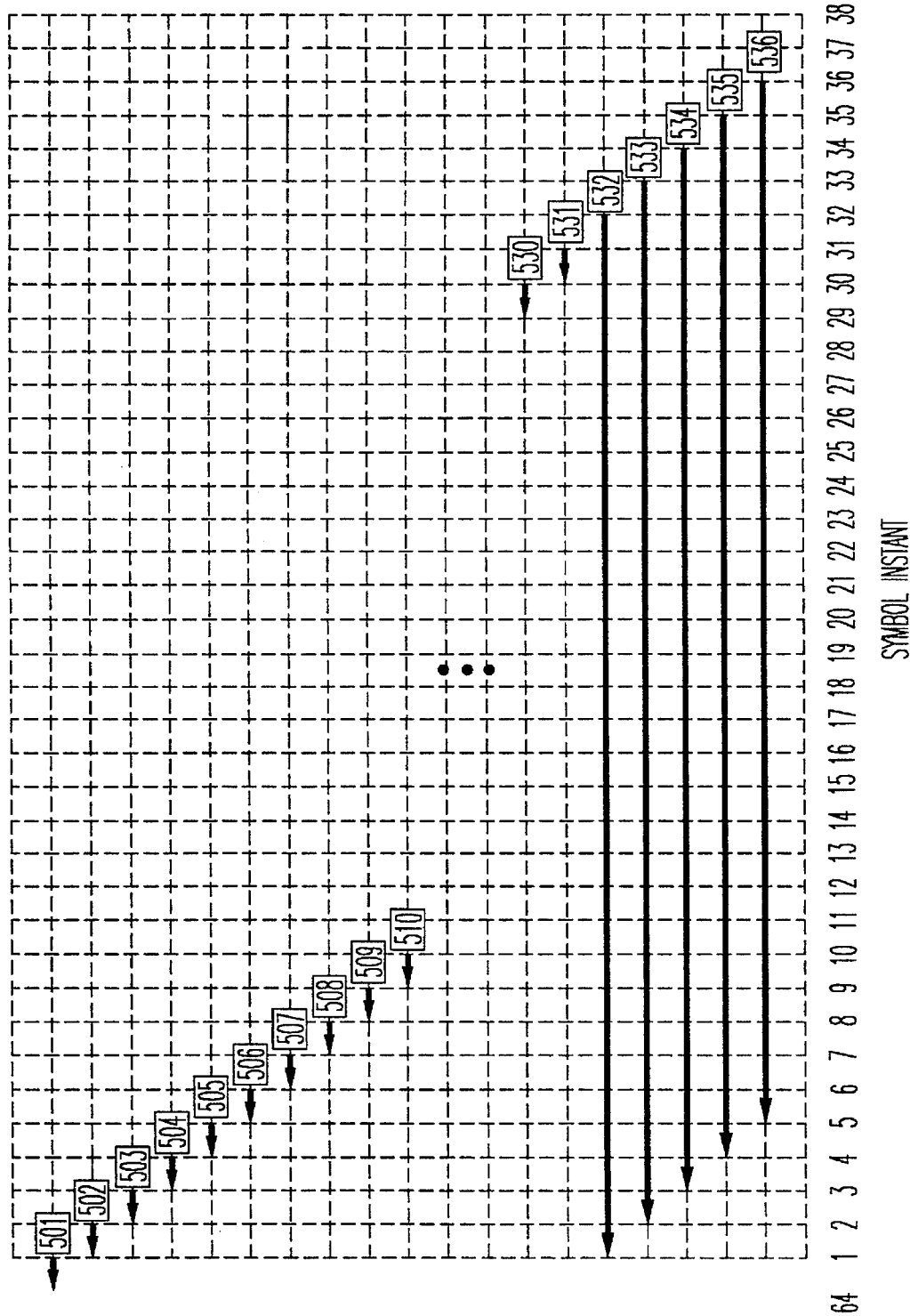
FIG. 5 is an illustration of tracebacks of various lengths.
Figure 6:
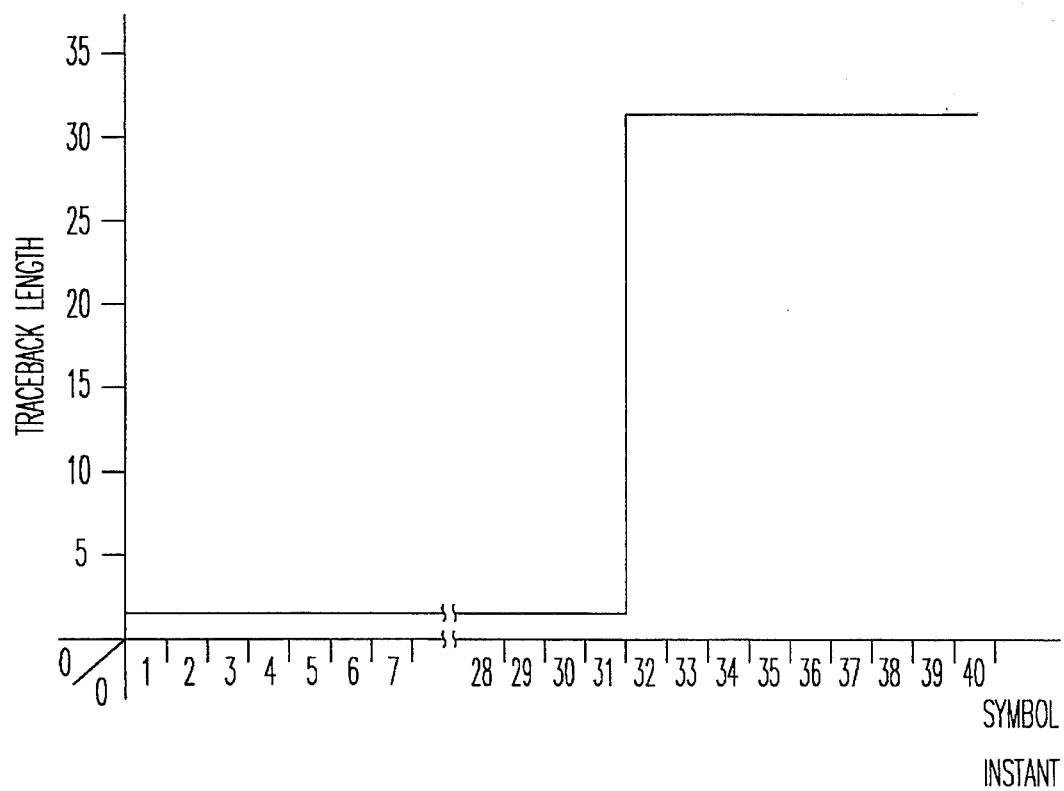
FIG. 6 is a graphical representation of the traceback lengths of FIG. 5, shown by symbol instant.

An example is shown in FIG. 5 in which an arrow is used to illustrate a traceback. The tail of the arrow is positioned above the symbol instant in which the traceback is initiated. The length of the arrow represents the length of the traceback. The head of the arrow is positioned above the previous symbol instant where a symbol is decoded. The traceback length 500 for each symbol instant is shown in FIG. 6.

The first traceback length is written to traceback length register 38. As the trellis is formed, a traceback 501 having a first traceback length is executed. A single instruction from DSP 20 to coprocessor 30 initiates a traceback by traceback unit 36. The first traceback length is very short, for example 1. The traceback may cycle into portions of the trellis having surviving branch data from a previous transmission burst. The decoded symbol at the end of this traceback is typically discarded.

Subsequent tracebacks 502, 503, 504 through 531 are executed having a first traceback length by repeated instructions to the traceback unit. The decoded symbol at the end of each such traceback is typically discarded. Executing a traceback having a very short traceback length where the decoded symbol is discarded minimizes the resources of time and energy expended in generating a symbol that has a low confidence level.

At a first predetermined symbol instant during construction of the trellis, the traceback length is changed to a second traceback length. This is achieved by over-writing traceback length register 38 with the second traceback length. Typically, the second traceback length is greater than the first traceback length. A traceback having a second traceback length is selected relative to the first predetermined symbol instant to assure that the traceback does not cycle into portions of the trellis having surviving branch data from a previous burst. For example, in symbol instant 32, a traceback 532 of length 31 can be initiated resulting in a decoded symbol in symbol instant 1. Decoded symbols from tracebacks having a second traceback length that are initiated in a sequence of symbol instants results in a series of decoded symbols. The decoded symbol resulting from a traceback having a second traceback length will be referred to as a final decoded symbol due to the confidence level in the decoding process. Longer traceback lengths provide greater accuracy in determining a decoded symbol and thereby provide greater confidence in the decoded symbol. Final decoded symbols are binary. How final decoded symbols are used is known in the art.

While traceback 501 cycled into a cell of the trellis in the traceback RAM 28 having branch origin data from a previous transmission burst, tracebacks 502 through 536 did not. More than one traceback could cycle into a cell or cells of the trellis from a previous transmission burst and still be within the scope of the present invention.

Figure 8:
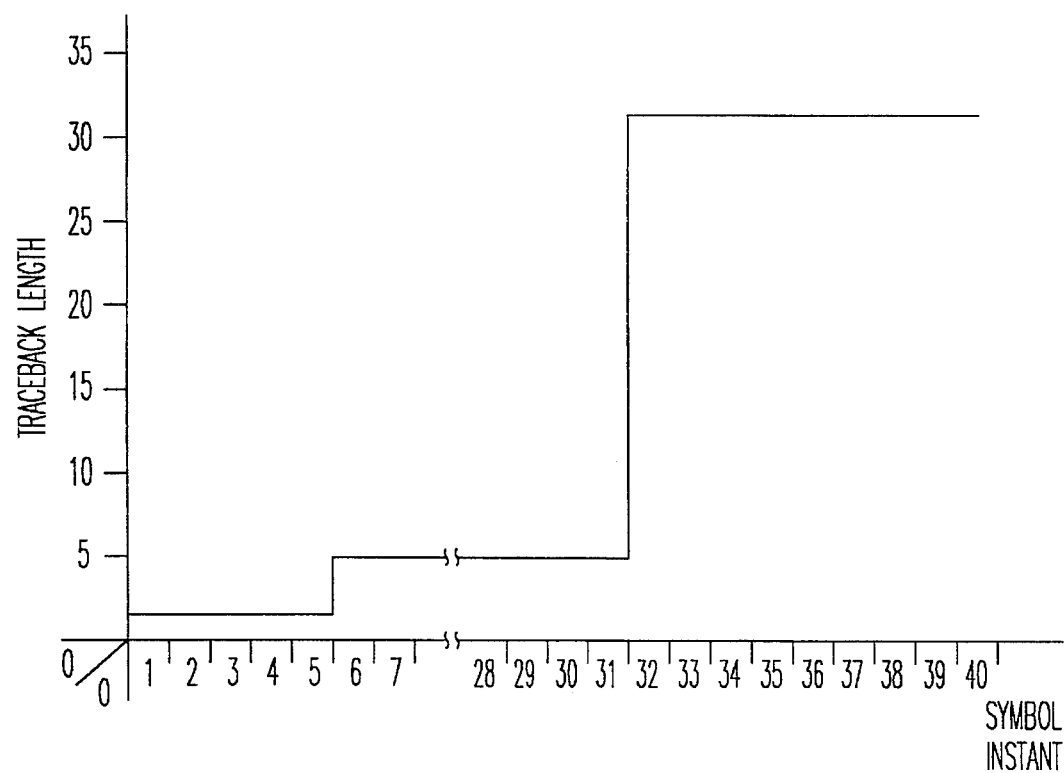
FIG. 8 is a graphical representation of the traceback lengths of FIG. 7.
Figure 7:
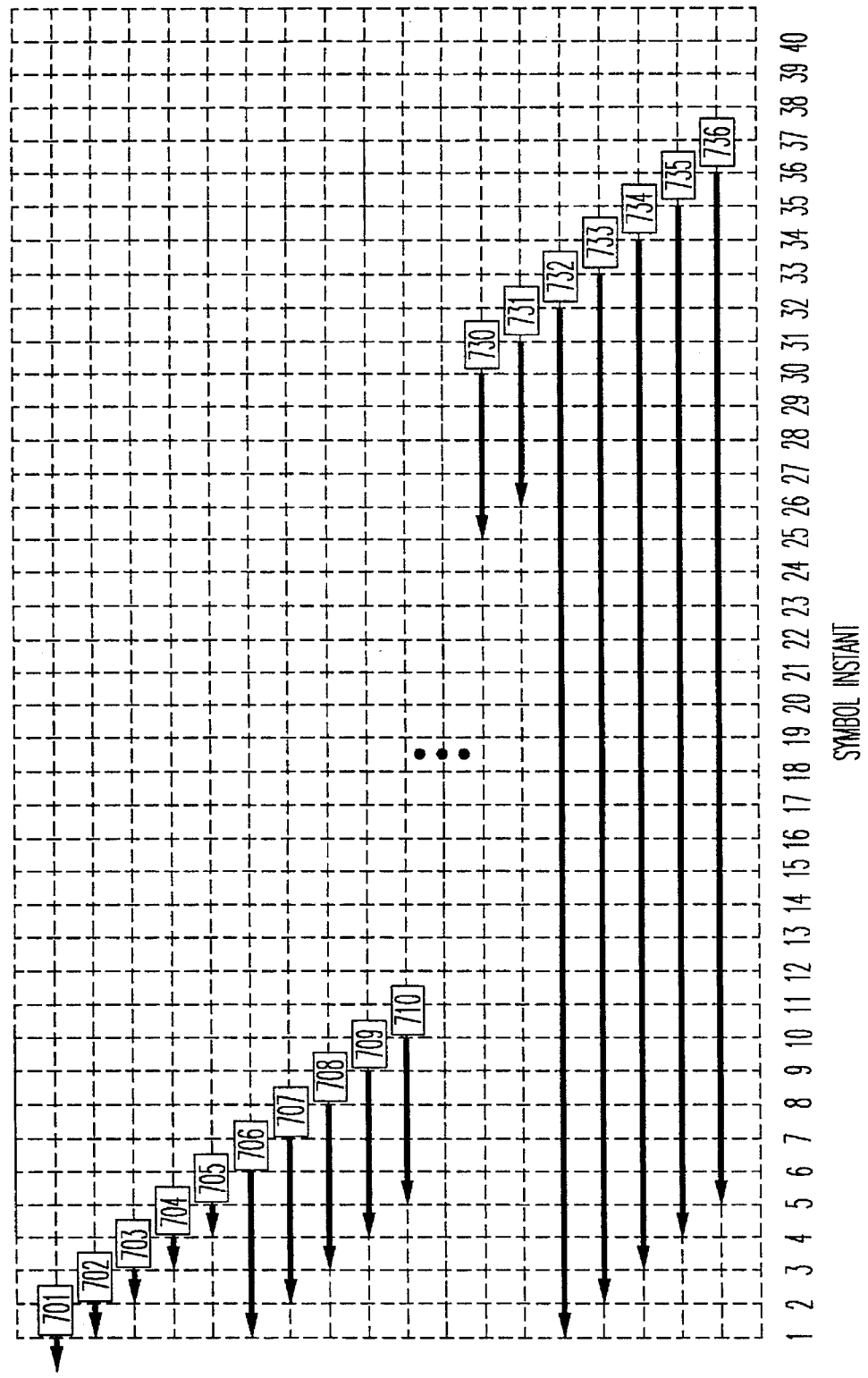
FIG. 7 is an illustration of tracebacks of various lengths similar to FIG. 5, exhibiting an intermediate length traceback.

In an alternative illustrative embodiment, some tracebacks may be executed having a third traceback length. These tracebacks result in ephemeral decoded symbols. At a second predetermined symbol instant the traceback length is changed to a third traceback length by over-writing the value in traceback length register 38. Typically, the third traceback length is greater than the first traceback length and shorter than the second traceback length. Typically, the magnitude of the third traceback length is less than the magnitude of the second predetermined symbol instant such that the traceback does not cycle into portions of the trellis having surviving branch data from a previous transmission burst. An example is shown in FIGS. 7 and 8 in which the third traceback length of 5 is introduced at symbol instant 6 resulting in traceback 706. The third traceback length is maintained through symbol instant 31. The traceback length 700 for each symbol instant is shown in FIG. 8. The decoded symbol resulting from a traceback having a third traceback length will be referred to as an ephemeral decoded symbol. Ephemeral decoded symbols are binary and may be used such as for channel adaptation as is known in the art.

At the first predetermined symbol instant, in this example 32, the traceback length is changed by writing the second traceback length, in this example 31, to traceback length register 38. Tracebacks executed having a second traceback length determine final decoded symbols.

Figure 9:
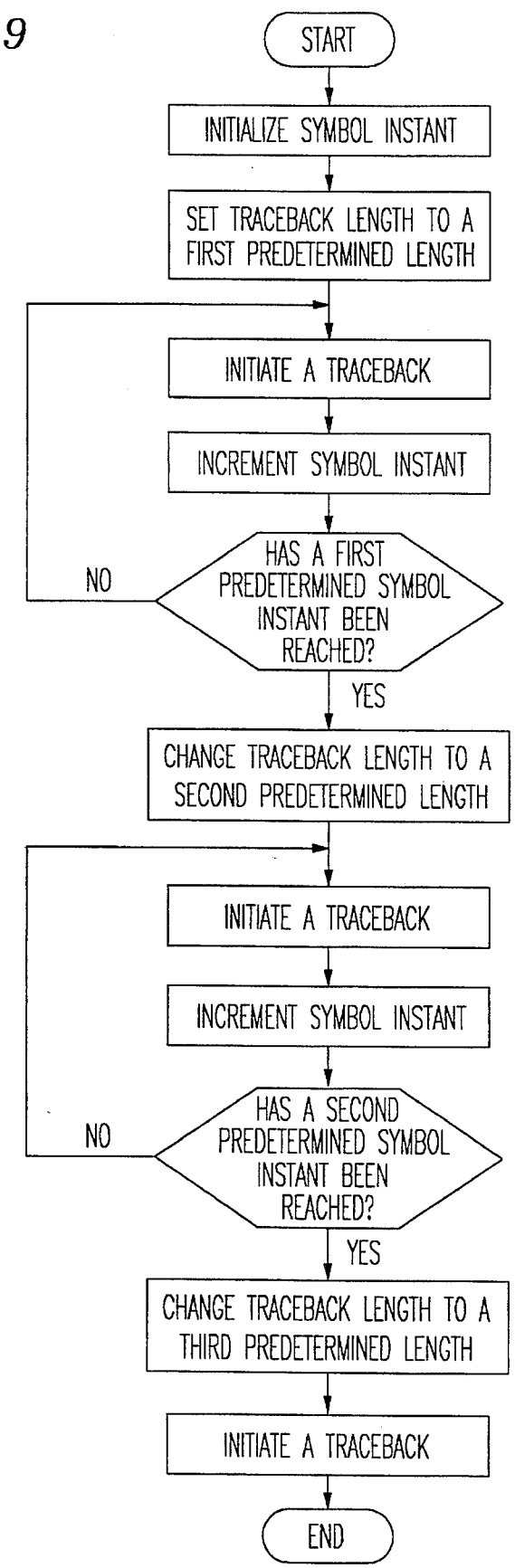
FIG. 9 is a flow chart of the steps in changing the length of tracebacks.

While exemplary numerical values were used to illustrate the various embodiments of the present invention, the invention is not limited to numerical values illustrated. Tracebacks of various lengths and sequences are contemplated within the scope of the invention. A flow chart of the steps in varying the traceback length is shown in FIG. 9. The START and END are not necessarily the logical beginning and ending of the process; they are for illustrative purposes. It is recognized this process of varying the traceback length may include all, a portion or more than the steps shown in FIG. 9.

The invention is particularly useful in communication systems and equipment employing integrated circuits including this technique. Such communications systems and equipment has the advantage of initiating a traceback of a programmable length from any symbol instant. In this manner, short initial tracebacks can be employed to reduce power consumption and save computation time.

While the illustrative embodiment of the invention has not been described as incorporating pipelining, one skilled in the art would recognize the enhanced computational efficiency available by utilizing pipelining in the design. Pipelining is achieved by initiating computation with a new data set before completing computations with a previous set of data. The more latches used in pipelining, the greater the depth of pipelining. Pipelining causes an initial latency in computation time required to fill the pipeline, but maximizes usage of resources such as adders and subtractors.

We claim:

1. A method of operating a digital communication system including a Viterbi decoder for tracing a path through a trellis of surviving branch data from various symbol instants of a current transmission burst to determine decoded symbols, the surviving branch data stored in an array of storage registers, the method comprising the steps of:

initiating a traceback having a first predetermined length from a first symbol instant, the traceback tracing a path back through the storage registers containing the surviving branch data to determine a decoded symbol;

changing the traceback length from the first predetermined length to a second predetermined length at a first predetermined symbol instant; and initiating a traceback having the second predetermined length to determine another decoded symbol.

2. The method of operating a digital communication system as recited in claim 1, wherein the step of changing the traceback length from the first predetermined length to the second predetermined length, comprises increasing the traceback length from the first predetermined length to the second predetermined length.

3. The method of operating a digital communication system as recited in claim 1, further comprising initiating a traceback having the first predetermined length from the first symbol instant until the first predetermined symbol instant is reached, and initiating the traceback having the second predetermined length from the first predetermined symbol instant.

4. The method of operating a digital communication system as recited in claim 1, wherein the step of initiating the traceback having the first predetermined length comprises initiating the traceback having the first predetermined length from the first symbol instant, the first predetermined length selected to minimize cycling into storage registers of the array containing the surviving branch data from a previous transmission burst.

5. The method of operating a digital communication system as recited in claim 1, further comprising the steps of:

changing the traceback length from the first predetermined length to a third predetermined length at a second predetermined symbol instant, the third predetermined length being between the first predetermined length and the second predetermined length in magnitude, the second predetermined symbol instant being between the first symbol instant and the first predetermined symbol instant;

initiating a traceback having the third predetermined length from the second predetermined symbol instant until the first predetermined symbol instant is reached; and changing the traceback length from the third predetermined length to the second predetermined length.

6. The method of operating a digital communication system as recited in claim 5, wherein the step of changing the traceback length from the first predetermined length to the third predetermined length, comprises increasing the traceback length from the first predetermined length to the third predetermined length.

7. The method of operating a digital communication system as recited in claim 5, wherein the step of changing the traceback length from the third predetermined length to the second predetermined length, comprises increasing the traceback length from the third predetermined length to the second predetermined length.

* * * * *